(12) United States Patent
Edamoto

(10) Patent No.: US 7,789,972 B2
(45) Date of Patent: Sep. 7, 2010

(54) SUBSTRATE PROCESSING APPARATUS AND SUBSTRATE PROCESSING METHOD

(75) Inventor: Nobuo Edamoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/336,724

(22) Filed: Dec. 17, 2008

(65) Prior Publication Data
US 2009/0090391 A1 Apr. 9, 2009

Related U.S. Application Data

(62) Division of application No. 11/216,869, filed on Aug. 29, 2005, now abandoned.

(30) Foreign Application Priority Data
Aug. 30, 2004 (JP) ............................. 2004-250494

(51) Int. Cl.
B08B 7/00 (2006.01)
B04B 7/08 (2006.01)
B04B 11/06 (2006.01)

(52) U.S. Cl. .............................. 134/33; 134/10; 494/63

(58) Field of Classification Search .................. None
See application file for complete search history.

(56) References Cited

U.S. PATENT DOCUMENTS 5,923,915 A 7/1999 Akimoto et al.
5,997,653 A 12/1999 Yamasaka
6,247,479 B1 * 6/2001 Taniyama et al. .......... 134/95.2
6,559,072 B2 * 5/2003 Davlin et al. ................ 438/782
2004/0050491 A1 3/2004 Miya et al.

FOREIGN PATENT DOCUMENTS

JP 10-172950 6/1998
JP 2004-111487 4/2004
JP 2004-153078 5/2004

OTHER PUBLICATIONS

Notice of Reason for Refusal issued Jul. 9, 2009 in connection with corresponding Japanese Patent Application No. 2004-250494.

* cited by examiner

Primary Examiner—Michael Cleveland
Assistant Examiner—Nicole Blan
(74) Attorney, Agent, or Firm—Ostrolenk Faber LLP

(57) ABSTRACT

A substrate processing apparatus according to the present invention comprises a substrate holding mechanism for holding a substrate and rotating the held substrate; a process liquid supply mechanism for supplying a process liquid to the substrate; a process liquid acquisition section arranged so as to enclose the substrate holding mechanism and having an acquisition port for acquiring the process liquid scattered by the rotation of the substrate; a movement mechanism for changing a relative position between the process liquid acquisition section and the substrate held by the substrate holding mechanism; and a control mechanism for controlling, when the process liquid scattered by the rotation of the substrate is acquired in the acquisition port, a relative position between the substrate and the acquisition port such that the scattered process liquid is acquired in the acquisition port on the basis of predetermined substrate process condition.

7 Claims, 6 Drawing Sheets

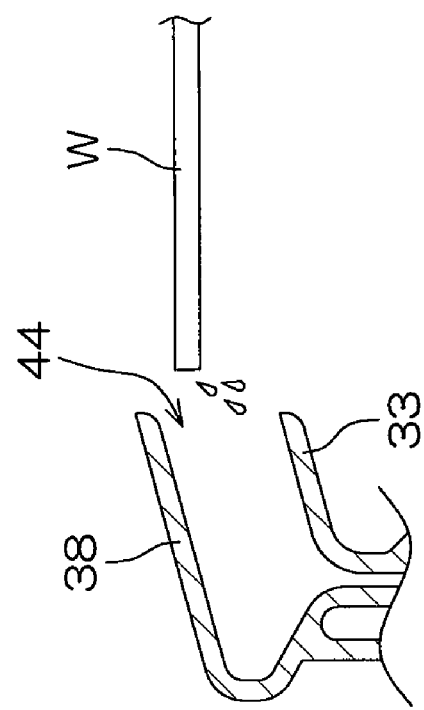
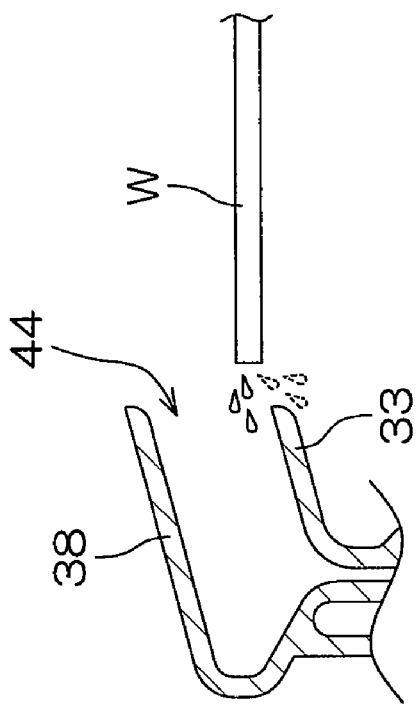
FIG. 4(a)
FIG. 4(b)

SUBSTRATE PROCESSING APPARATUS AND SUBSTRATE PROCESSING METHOD

CROSS-REFERENCE TO RELATED APPLICATIONS

The present application is a Divisional Application of U.S. Ser. No. 11/216,869 filed Aug. 29, 2005 now abandoned, which application claims the benefit and priority of JP2004-250494 filed Aug. 30, 2004, both incorporated by reference.

BACKGROUND OF THE INVENTION

1. Field of the Invention

The present invention relates to a substrate processing apparatus and a substrate processing method for processing a substrate using a process liquid. Examples of the substrate to be processed include a semiconductor wafer, a glass substrate for a liquid crystal display device, a glass substrate for a plasma display, a substrate for an optical disk, a substrate for a magnetic disk, a substrate for a magneto-optic disc, and a substrate for a photomask.

2. Description of Related Art

In the steps of manufacturing semiconductor devices and liquid crystal display devices, a single substrate processing apparatus for processing substrates one at a time may, in some cases, be used in order to subject a surface of a substrate such as a semiconductor wafer or a glass substrate for a liquid crystal display panel to process using a process liquid. Some of this type of substrate processing apparatus are ones so constructed as to recover the process liquid that has been used for processing the substrate and reusing the recovered process liquid for the subsequent process in order to reduce the consumption of the process liquid.

A substrate processing apparatus so configured that a process liquid is reusable comprises a spin chuck for rotating a substrate with the substrate held in a substantially horizontal posture by a plurality of chuck pins, a cup in the shape of a closed-end cylinder accommodating the spin chuck, and a splash guard provided so as to be capable of being raised and lowered to and from the cup.

A discharge groove for discharging the process liquid that has been used for processing the substrate is formed at the bottom of the cup so as to enclose the spin chuck. Further, first to third recovery grooves for recovering the process liquid that has been used for processing the substrate are formed in a triple manner, for example, at the bottom of the cup so as to enclose the discharge groove. A discharge line for introducing the process liquid to discharge process facilities (not shown) is connected to the discharge groove. Recovery lines for introducing the process liquid to recovery treatment facilities (not shown) are respectively connected to the first to third recovery grooves.

The splash guard is so configured that four umbrella-shaped members that differ in size are overlapped with one another in the vertical direction. An up-and-down driving mechanism including a ball screw mechanism or the like, for example, is coupled to the splash guard. The splash guard can be raised and lowered to and from the cup (spin chuck) by the up-and-down driving mechanism.

Each of the umbrella-shaped members has a shape that is almost rotationally symmetrical about a rotation axis of the substrate, and comprises an inclined surface inclined obliquely upward so as to come close to the rotation axis. Upper edges of the inclined surfaces of the umbrella-shaped members are positioned apart from one another in a direction along the rotation axis of the substrate on a cylindrical surface with the rotation axis of the substrate as its central axis. Consequently, an annular first recovery opening for causing the process liquid scattered from the substrate to enter a portion between an upper end of the inclined surface of the uppermost first umbrella-shaped member and an upper end of the inclined surface of the second umbrella-shaped member just below the first umbrella-shaped member is formed therebetween. Further, an annular second recovery opening for causing a process liquid scattered from the substrate to enter a portion between the upper end of the inclined surface of the second umbrella-shaped member and an upper end of the inclined surface of the third umbrella-shaped member just below the second umbrella-shaped member is formed therebetween. Further, an annular third recovery opening for causing the process liquid scattered from the substrate to enter a portion between the upper end of the inclined surface of the third umbrella-shaped member and an upper end of the inclined surface of the lowermost fourth umbrella-shaped member is formed therebetween. A discharge opening for causing a process liquid scattered from the substrate to enter a portion between the lowermost fourth umbrella-shaped member and a bottom surface of the cup is formed therebetween. The process liquids entered into the first to third recovery openings are respectively introduced into the first to third recovery grooves at the bottom of the cup. The process liquid entered into the discharge opening is introduced into the discharge groove at the bottom of the cup.

In the substrate processing apparatus having such a configuration, it is possible to successively supply a plurality of types of process liquids to the surface of the substrate to successively subject the surface of the substrate to process using the plurality of types of process liquids and to classify and recover the plurality of types of process liquids used for the process.

That is, the surface of the substrate can be subjected to the process using a first process liquid by supplying the first process liquid to the surface of the substrate while rotating the substrate by the spin chuck. The first process liquid supplied to the surface of the substrate is scattered sideward from a peripheral edge of the substrate upon receipt of a centrifugal force produced by the rotation of the substrate. If the splash guard is raised and lowered to oppose the first recovery opening to an end surface of the substrate at this time, therefore, the first process liquid scattered from the peripheral edge of the substrate can be entered into the first recovery opening and collected in the first recovery groove. The first process liquid can be recovered through a recovery line from the first recovery groove. Similarly, in a case where a second process liquid is supplied to the surface of the substrate, when the second recovery opening is opposed to the end surface of the substrate, the second process liquid scattered from the substrate can be entered. Further, in a case where a third process liquid is supplied to the surface of the substrate, when the third recovery opening is opposed to the end surface of the substrate, the third process liquid scattered from the substrate can be entered. In a case where rinsing process for washing away the surface of the substrate with deionized water by supplying the deionized water to the surface of the substrate while rotating the substrate by the spin chuck, if the discharge opening is opposed to the end surface of the substrate, the deionized water that has washed away the surface of the substrate can be collected in the discharge groove. The deionized water can be discharged through a discharge line from the discharge groove.

However, the direction of the process liquid scattered from the substrate (the scattering direction of the process liquid) differs depending on process conditions such as the rotation speed of the substrate by the spin chuck, the supply angle of the process liquid on the substrate, the supply flow rate of the process liquid to the substrate, and the type (concentration, viscosity, temperature) of the process liquid. Therefore, in such a configuration that the first to third recovery openings are arranged at predetermined positions opposed to the end surface of the substrate while the first to third process liquids are supplied to the surface of the substrate, when the process conditions are changed, the enter amount of the process liquid into the recovery opening opposed to the end surface of the substrate (the opening in which the process liquid is scheduled to be recovered) is reduced so that the recovery efficiency of the process liquid may be reduced.

SUMMARY

An object of the present invention is to provide a substrate processing apparatus and a substrate processing method in which a process liquid can be efficiently recovered.

A substrate processing apparatus according to an aspect of the present invention comprises a substrate holding mechanism for holding a substrate and rotating the held substrate; a process liquid supply mechanism for supplying a process liquid to the substrate held by the substrate holding mechanism; a process liquid acquisition section arranged so as to enclose the substrate holding mechanism and having an acquisition port for acquiring the process liquid scattered by the rotation of the substrate held by the substrate holding mechanism; a movement mechanism for changing a relative position between the process liquid acquisition section and the substrate held by the substrate holding mechanism; and a control mechanism for controlling, when the process liquid scattered by the rotation of the substrate held by the substrate holding mechanism is acquired in the acquisition port, a relative position between the substrate held by the substrate holding mechanism and the acquisition port such that the scattered process liquid is acquired in the acquisition port on the basis of predetermined substrate process condition.

According to such a configuration, even if the scattering direction of the process liquid from the substrate is changed as the substrate process conditions are changed when the process liquid scattered from the substrate is acquired in the acquisition port, the process liquid scattered from the substrate can be satisfactorily acquired in the acquisition port by controlling the relative position between the substrate and the acquisition port depending on the change. Therefore, the process liquid can be efficiently recovered throughout the whole period during which the process liquid is supplied to the substrate.

The substrate process conditions may be at least one of the rotation speed of the substrate held by the substrate holding mechanism, the state of the process liquid supplied from the process liquid supply mechanism, the discharge angle of the process liquid supplied from the process liquid supply mechanism, and the discharge position of the process liquid supplied from the process liquid supply mechanism. Even when at least one of the rotation speed of the substrate, and the state, the discharge angle, and the discharge position of the process liquid supplied from the process liquid supply mechanism is changed so that the direction of the process liquid scattered from the substrate is changed, the process liquid scattered from the substrate can be satisfactorily acquired by the acquisition port by controlling the relative position between the substrate and the acquisition port. Therefore, efficient recovery of the process liquid can be achieved.

That is, in a case where the substrate process conditions are the rotation speed of the substrate held by the substrate holding mechanism, the control mechanism carries out control, in the relative position to the substrate held by the substrate holding mechanism, such that the position of the acquisition port in a case where the rotation speed is a first speed is higher than the position of the acquisition port in a case where the rotation speed is a second speed lower than the first speed.

In a case where the substrate process condition is the state of the process liquid supplied from the process liquid supply mechanism, when the state of the process liquid is the concentration of the process liquid supplied from the process liquid supply mechanism, the control mechanism carries out control, in the relative position to the substrate held by the substrate holding mechanism, such that the position of the acquisition port in a case where the concentration of the process liquid supplied from the process liquid supply mechanism is a first concentration is higher than the position of the acquisition port in a case where the concentration of the process liquid is a second concentration higher than the first concentration. Further, in a case where the state of the process liquid is the temperature of the process liquid supplied from the process liquid supply mechanism, the control mechanism carries out control, in the relative position to the substrate held by the substrate holding mechanism, such that the position of the acquisition port in a case where the temperature of the process liquid supplied from the process liquid supply mechanism is a first temperature is higher than the position of the acquisition port in a case where the temperature of the process liquid is a second temperature lower than the first temperature. Furthermore, in a case where the state of the process liquid is the viscosity of the process liquid supplied from the process liquid supply mechanism, the control mechanism carries out control, in the relative position to the substrate held by the substrate holding mechanism, such that the position of the acquisition port in a case where the viscosity of the process liquid supplied from the process liquid supply mechanism is a first viscosity is higher than the position of the acquisition port in a case where the viscosity of the process liquid is a second viscosity higher than the first viscosity.

The substrate process condition may be the supply position on a surface of the substrate of the process liquid supplied from the process liquid supply mechanism.

The substrate process condition may be the type of the process liquid supplied from the process liquid supply mechanism. In a case where process liquids, which differ in type, scattered from the substrate are acquired in the same acquisition port, the process liquid scattered from the substrate can be satisfactorily acquired by controlling the relative position between the substrate and the acquisition port even if the scattering direction from the substrate differs depending on the type of the process liquid. Therefore, efficient recovery of the process liquid can be achieved.

It is preferable that there is further provided a storage mechanism for storing the most suitable relative position, between the substrate held by the substrate holding mechanism and the acquisition port, corresponding to the substrate process condition, and the control mechanism controls the movement mechanism on the basis of the storage mechanism. In this case, the relative position between the substrate and the acquisition port can be controlled to the most suitable relative position corresponding to the substrate process conditions on the basis of contents stored in the storage mechanism.

There may be further provided a detection mechanism for detecting the measured values of the substrate process conditions, and the control mechanism may control the movement mechanism on the basis of the measured values detected by the detection mechanism. According to such a configuration, even when the substrate process conditions are changed during the supply of the process liquid to the substrate, the relative position between the substrate and the acquisition port can be controlled to the most suitable relative position corresponding to the substrate process conditions by following the change.

The detection mechanism may comprise a liquid amount detection mechanism for detecting the amount of the process liquid acquired in the process liquid acquisition section. In other words, the measured values of the substrate process condition may include the amount of the process liquid acquired in the process liquid acquisition section.

In a case where the substrate process condition includes the concentration of the process liquid supplied from the process liquid supply mechanism, the detection mechanism may comprise a concentration detection mechanism for detecting the concentration of the process liquid supplied from the process liquid supply mechanism.

In a substrate processing method for supplying a process liquid to a substrate and rotating the substrate to treat the substrate, a substrate processing method according to another aspect of the present invention comprises the step of controlling, when a process liquid acquisition section arranged so as to enclose the substrate and having an acquisition port for acquiring the process liquid scattered by the rotation of the substrate is used to acquire the process liquid scattered from the substrate in the acquisition port, a relative position between the substrate and the acquisition port such that the scattered process liquid is acquired in the acquisition port on the basis of predetermined substrate process condition.

According to such a method, even if the scattering direction of the process liquid from the substrate is changed as the substrate process conditions are changed when the process liquid scattered from the substrate is acquired in the acquisition port, the process liquid scattered from the substrate can be satisfactorily acquired in the acquisition port by controlling the relative position between the substrate and the acquisition port depending on the change. Therefore, the process liquid can be efficiently recovered throughout the whole period during which the process liquid is supplied to the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing the position of a splash guard at the time of supplying a first chemical liquid;

DETAILED DESCRIPTION

Figure 1:
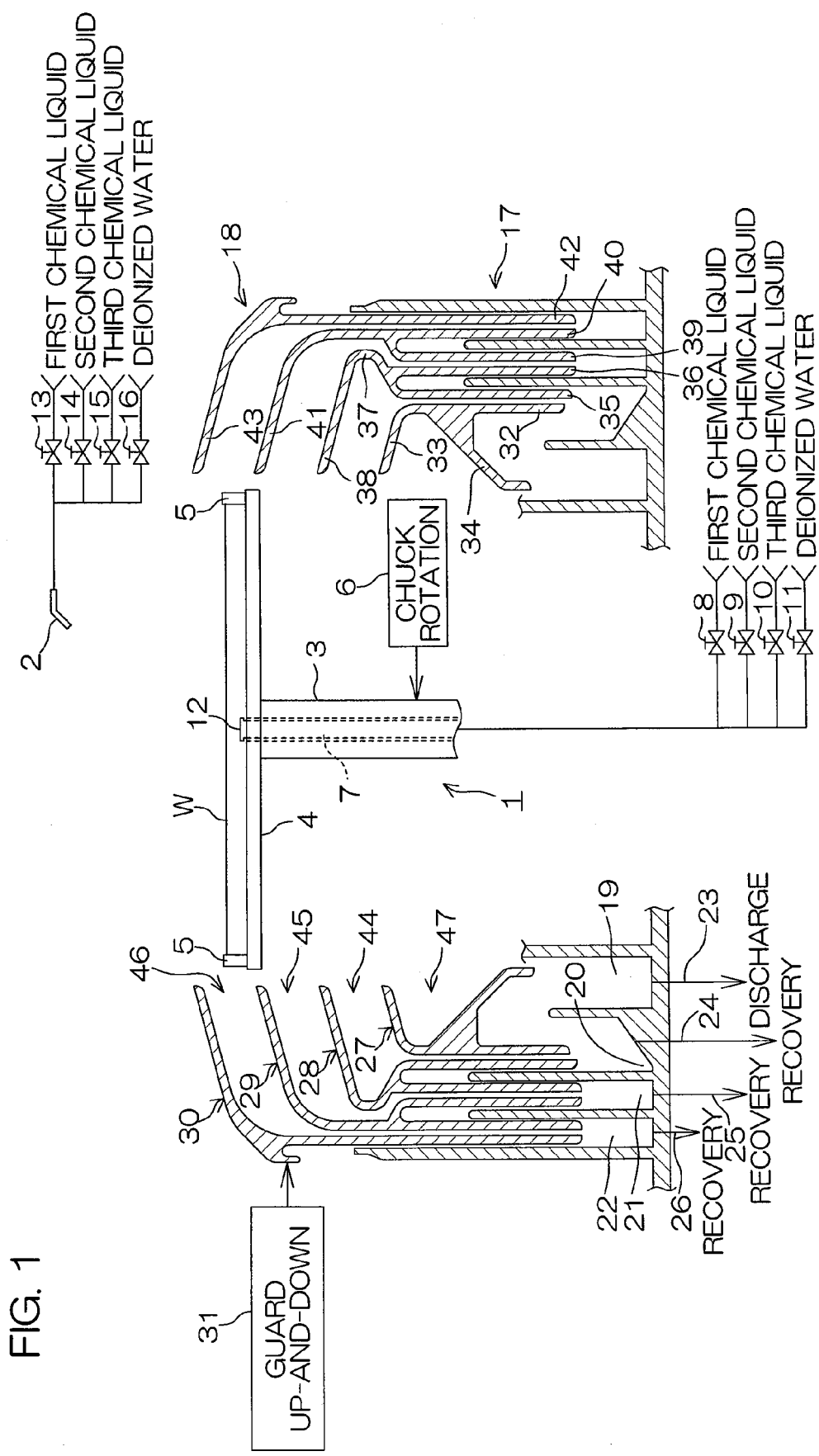
FIG. 1 is a cross-sectional view conceptually showing the configuration of a substrate processing apparatus according to an embodiment of the present invention.

FIG. 1 is a cross-sectional view conceptually showing the configuration of a substrate processing apparatus according to an embodiment of the present invention. The substrate processing apparatus is an apparatus for successively (selectively) supplying a first chemical liquid, a second chemical liquid, a third chemical liquid, and deionized water serving as a process liquid to a surface of a wafer W that is an example of a substrate and subjecting the wafer W to washing process. The substrate processing apparatus comprises a spin chuck 1 for holding the wafer W almost horizontally and rotating the held wafer W, and a nozzle 2 for supplying the first chemical liquid, the second chemical liquid, the third chemical liquid, and the deionized water to a surface (upper surface) of the wafer W held in the spin chuck 1.

The spin chuck 1 comprises a spin shaft 3 extending almost vertically, a spin base 4 mounted on an upper end of the spin shaft 3 almost horizontally, and a plurality of holding members 5 provided upright on an upper surface of the spin base 4. The holding members 5 are arranged at approximately equal angular intervals on a circumference with a central axis of the spin shaft 3 as its center. The holding members 5 can hold the wafer W in a substantially horizontal posture by holding an end surface of the wafer W at a plurality of different positions.

A chuck rotation driving mechanism 6 including a driving source such as a motor is coupled to the spin shaft 3. The wafer W, together with the spin base 4, can be rotated around the central axis of the spin shaft 3 by inputting a rotational force to the spin shaft 3 from the chuck rotation driving mechanism 6 in a state where the wafer W is held by the holding members 5 and rotating the spin shaft 3 around the central axis.

The spin shaft 3 is a hollow shaft, and a reverse process liquid supply tube 7 is inserted into the spin shaft 3. The first chemical liquid can be supplied to the reverse process liquid supply tube 7 from a first chemical liquid supply source through a first chemical liquid lower valve 8. The second chemical liquid can be supplied to the reverse process liquid supply tube 7 from a second chemical liquid supply source through a second chemical liquid lower valve 9. Further, the third chemical liquid can be supplied to the reverse process liquid supply tube 7 from a third chemical liquid supply source through a third chemical liquid lower valve 10. Furthermore, the deionized water can be supplied to the reverse process liquid supply tube 7 from a deionized water supply source through a deionized water lower valve 11. The reverse process liquid supply tube 7 extends to a position in the vicinity of the center of a reverse surface (lower surface) of the wafer W held in the spin chuck 1 (the plurality of holding members 5), and has a reverse nozzle 12 for discharging the first chemical liquid, the second chemical liquid, the third chemical liquid, and the deionized water (process liquid) to be selectively supplied to the reverse process liquid supply tube 7 provided at its front end. The reverse nozzle 12 discharges the process liquid upward almost vertically. The process liquid discharged from the reverse nozzle 12 is supplied to the center of the reverse surface of the wafer W held in the spin chuck 1 almost vertically.

The first chemical liquid can be supplied to the nozzle 2 from the first chemical liquid supply source through a first chemical liquid upper valve 13. The second chemical liquid can be supplied to the nozzle 2 from the second chemical liquid supply source through a second chemical liquid upper valve 14. Further, the third chemical liquid can be supplied to the nozzle 2 from the third chemical liquid supply source through a third chemical liquid upper valve 15. Furthermore, the deionized water can be supplied to the nozzle 2 from the deionized water supply source through a deionized water upper valve 16.

The spin chuck 1 is accommodated within a cup 17 in the shape of a closed-end cylinder. A splash guard 18 that can be raised and lowered to and from the cup 17 is provided above the cup 17.

A discharge groove 19 for discharging the process liquid that has been used for processing the wafer W is formed in an annular shape with the rotation axis of the wafer W (the central axis of the spin shaft 3) as its center at the bottom of the cup 17. A first recovery groove 20, a second recovery groove 21, and a third recovery groove 22 in an annular shape for recovering the process liquid that has been used for processing the wafer W are formed in a triple manner so as to enclose the discharge groove 19 at the bottom of the cup 17. A discharge line 23 for introducing the process liquid to discharge process facilities (not shown) is connected to the discharge groove 19. A first recovery line 24, a second recovery line 25, and a third recovery line 26 for introducing the process liquid to recovery treatment facilities (not shown) are respectively connected to the first recovery groove 20, the second recovery groove 21, and the third recovery groove 22.

The splash guard 18 is configured by overlapping four umbrella-shaped members 27, 28, 29, and 30 that differ in size. A guard up-and-down driving mechanism 31 including a servo motor, a ball screw mechanism, or the like, for example, is coupled to the splash guard 18. The splash guard 18 can be raised and lowered (moved up and down) to and from the cup 17 by the guard up-and-down driving mechanism 31.

Each of the umbrella-shaped members 27 to 30 has a shape that is almost rotationally symmetrical about the rotation axis of the wafer W.

The umbrella-shaped member 27 comprises a cylinder section 32 in a cylindrical shape with the rotation axis of the wafer W as its central axis, an inclined section 33 extending obliquely upward toward the center (in a direction nearer to the rotation axis of the wafer W) from an upper end of the cylinder section 32, and a discharged liquid guiding section 34 extending obliquely downward toward the center from the upper end of the cylinder section 32. A lower end of the cylinder section 32 is positioned on the first recovery groove 20. A lower end of the discharged liquid guiding section 34 is positioned on the discharge groove 19. Further, the cylinder section 32 and the discharged liquid guiding section 34 respectively have such lengths that their respective lower ends are not brought into contact with a bottom surface of the cup 17 when the splash guard 18 is lowered to the lowermost retreat position.

The umbrella-shaped member 28 comprises cylinder sections 35 and 36 provided so as to enclose the cylinder section 32 in the umbrella-shaped member 27 and having a coaxially cylindrical shape with the rotation axis of the wafer W as its central axis, a connection section 37 for connecting upper ends of the cylinder sections 35 and 36 and having an approximately U shape in cross section opening toward the rotation axis of the wafer W, and an inclined section 38 extending obliquely upward toward the center from an upper end of the connection section 37. A lower end of the cylinder section 35 on the inner side (on the side of the center) is positioned on the first recovery groove 20. A lower end of the cylinder section 36 on the outer side is positioned on the second recovery groove 21. The cylinder sections 35 and 36 have such lengths that their respective lower ends are not brought into contact with the bottom surface of the cup 17 when the splash guard 18 is lowered to the lowermost retreat position.

The umbrella-shaped member 29 comprises cylinder sections 39 and 40 provided so as to enclose the cylinder section 36 in the umbrella-shaped member 28 and having a coaxially cylindrical shape with the rotation axis of the wafer W as its central axis, and an inclined section 41 extending obliquely upward toward the center from an upper end of the cylinder section 40 on the outer side. A lower end of the cylinder section 39 on the inner side is positioned on the second recovery groove 21. A lower end of the cylinder section 40 on the outer side is positioned on the third recovery groove 22. The cylinder sections 39 and 40 have such lengths that their respective lower ends are not brought into contact with the bottom surface of the cup 17 when the splash guard 18 is lowered to the lowermost retreat position.

The umbrella-shaped member 30 comprises a cylinder section 42 provided so as to enclose the cylinder section 40 in the umbrella-shaped member 29 and having a cylindrical shape with the rotation axis of the wafer W as its central axis, and an inclined section 43 extending obliquely upward toward the center from an upper end of the cylinder section 42. The cylinder section 42 is positioned on the third recovery groove 22 and has such a length that its lower end is not brought into contact with the bottom surface of the cup 17 when the splash guard 18 is lowered to the lowermost retreat position.

Upper edges of the inclined sections 33, 38, 41, and 43 are positioned apart from one another in a direction along the rotation axis of the wafer W (in a vertical direction) on a cylindrical surface with the rotation axis of the wafer W as its central axis. Consequently, a first recovered liquid acquisition port 44 in an annular shape for entering the process liquid (first chemical liquid) scattered from the wafer W and collecting the process liquid in the first recovery groove 20 is formed between the upper edge of the inclined section 33 and the upper edge of the inclined section 38. A second recovered liquid acquisition port 45 in an annular shape for entering the process liquid (second chemical liquid) scattered from the wafer W and collecting the process liquid in the second recovery groove 21 is formed between the upper edge of the inclined section 38 and the upper edge of the inclined section 41. Further, a third recovered liquid acquisition port 46 in an annular shape for entering the process liquid (third chemical liquid) scattered from the wafer W and collecting the process liquid in the third recovery groove 22 is formed between the upper edge of the inclined section 41 and the upper edge of the inclined section 43. Furthermore, a discharged liquid acquisition port 47 for acquiring the process liquid scattered from the wafer W is formed between the upper edge of the inclined section 33 and the discharged liquid guiding section 34.

Figure 2:
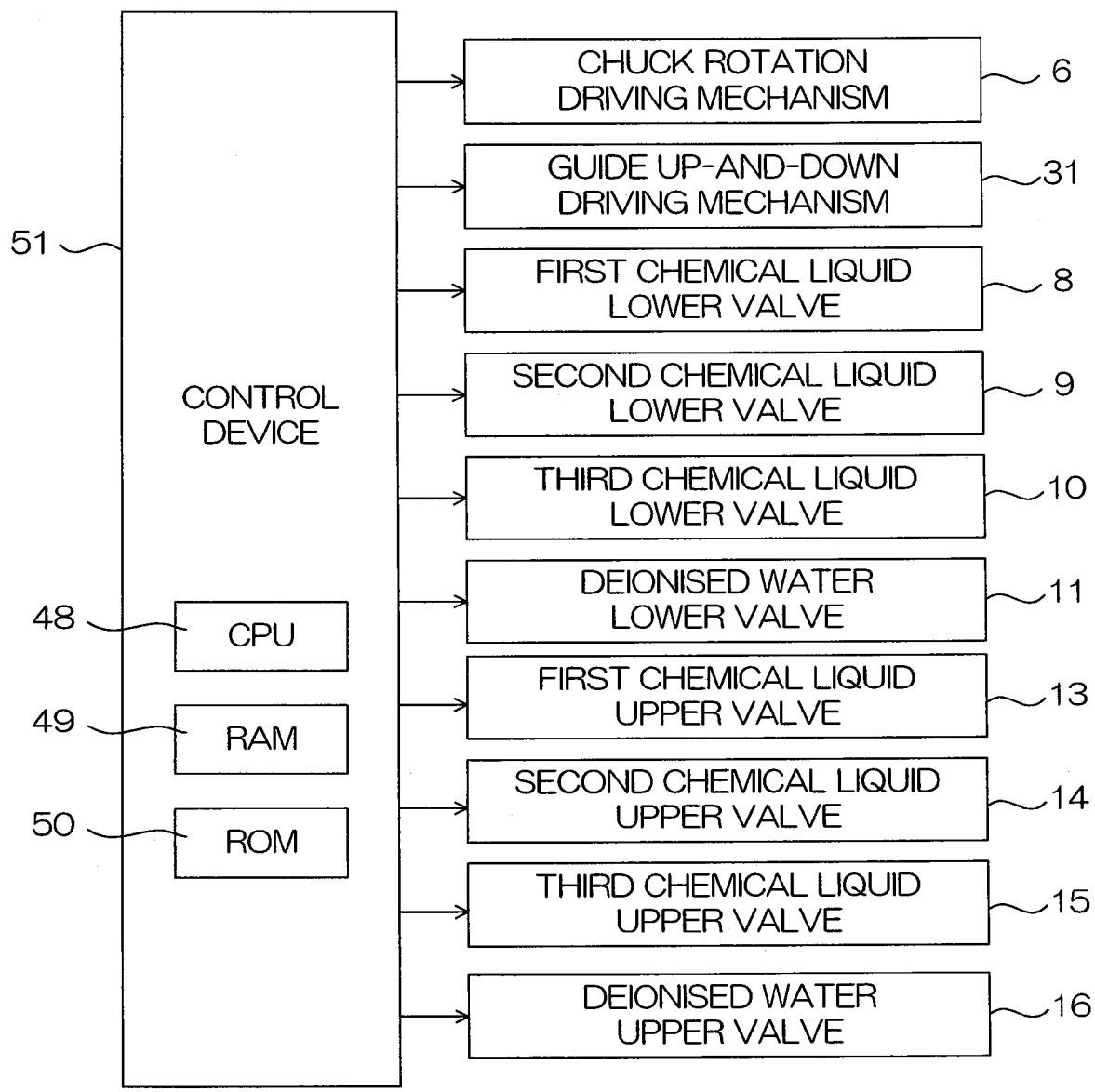
FIG. 2 is a block diagram showing the electrical configuration of the substrate processing apparatus.

FIG. 2 is a block diagram showing the electrical configuration of the substrate processing apparatus. The substrate processing apparatus comprises a control device 51 comprising a CPU 48, a RAM 49, and a ROM 50.

The chuck rotation driving mechanism 6, the guide up-and-down driving mechanism 31, the first chemical liquid lower valve 8, the second chemical liquid lower valve 9, the third chemical liquid lower valve 10, the deionized water lower valve 11, the first chemical liquid upper valve 13, the second chemical liquid upper valve 14, the third chemical liquid upper valve 15, the deionized water upper valve 16, and so forth are connected as control objects to the control device 51.

The control device 51 controls the operations of the chuck rotation driving mechanism 6 and the guard up-and-down driving mechanism 31 in accordance with a program stored in the ROM 50. The control device 51 controls the opening or closing of the first chemical liquid lower valve 8, the second chemical liquid lower valve 9, the third chemical liquid lower valve 10, the deionized water lower valve 11, the first chemical liquid upper valve 13, the second chemical liquid upper valve 14, the third chemical liquid upper valve 15, and the deionized water upper valve 16 in accordance with a program stored in the ROM 50.

Figure 3:
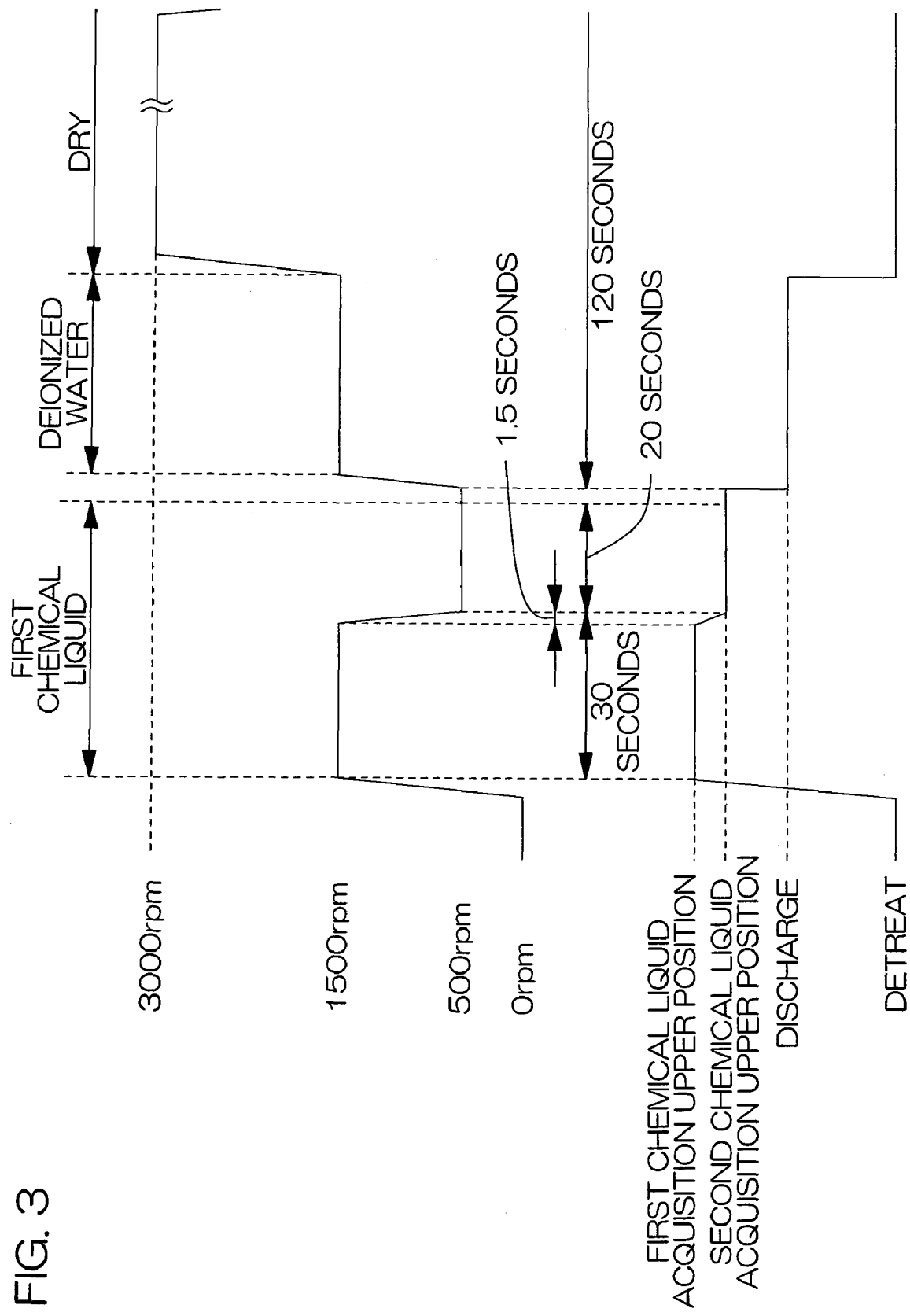
FIG. 3 is a timing chart for explaining control at the time of washing process using a first chemical liquid.

FIG. 3 is a timing chart for explaining control at the time of washing process using the first chemical liquid. Before the wafer W to be processed is carried in the spin chuck 1, the splash guard 18 is lowered to the lowermost retreat position so as not to prevent the carrying-in, so that the inclined section 43 in the splash guard 18 is positioned below the position where the wafer W is held by the spin chuck 1.

The wafer W to be processed is held in the spin chuck 1 with its surface (device formation surface) directed upward. When the wafer W is held in the spin chuck 1, the chuck rotation driving mechanism 6 is controlled, so that the rotation of the wafer W by the spin chuck 1 is started, and the rotation speed of the wafer W is raised to 1500 rpm. The guard up-and-down driving mechanism 31 is controlled, so that the splash guard 18 is raised from the retreat position to a first chemical liquid acquisition upper position where the first recovered liquid acquisition port 44 is opposed to the end surface of the wafer W (see FIG. 4 (*a*)) by following the rise in the rotation speed of the wafer W.

When the first chemical liquid is supplied to the surface and the reverse surface of the wafer W that is rotated at a rotation speed of 1500 rpm by previously carrying out experiments, the position where the first chemical liquid scattered from the wafer W can be most efficiently acquired (entered) in the first recovered liquid acquisition port 44 (the position where the flow rate of the first chemical liquid flowing through the first recovery line 24 is the highest) is found, and the position is set to the first chemical liquid acquisition upper position. The driving amount of the guard up-and-down driving mechanism 31 (servo motor) for moving the splash guard 18 to the first chemical liquid acquisition upper position is stored in the ROM 50. The guard up-and-down driving mechanism 31 is controlled on the basis of the driving amount stored in the ROM 50.

When the rotation speed of the wafer W reaches 1500 rpm, the first chemical liquid lower valve 8 and the first chemical liquid upper valve 13 are opened, so that the first chemical liquid is supplied to the rotation center on the surface of the wafer W from the nozzle 2, and the first chemical liquid is supplied to the rotation center on the reverse surface of the wafer W from the reverse nozzle 12. The first chemical liquid supplied to the surface and the reverse surface of the wafer W flows toward a peripheral edge of the wafer W by a centrifugal force produced by the rotation of the wafer W, and is scattered sideward from the peripheral edge of the wafer W and entered into the first recovered liquid acquisition port 44 opposed to the end surface of the wafer W at this time. The first chemical liquid entered into the first recovered liquid acquisition port 44 is collected in the first recovery groove 20, and is recovered in the recovery treatment facilities for treating the first chemical liquid so as to be reusable through the first recovery line 24.

Thereafter, when 30 seconds have elapsed since the supply of the first chemical liquid to the wafer W was started, the rotation speed of the wafer W is lowered from 1500 rpm to 500 rpm in 1.5 seconds. The supply of the first chemical liquid to the surface and the reverse surface of the wafer W is continued while the wafer W is rotated at a rotation speed of 500 rpm.

When the rotation speed of the wafer W is lowered from 1500 rpm to 500 rpm, the direction of the first chemical liquid scattered from the wafer W (the scattering direction of the first chemical liquid) is changed from a substantially horizontal direction to an obliquely downward direction, as indicated by a broken line in FIG. 4 (*a*). As described in the foregoing, the first chemical liquid acquisition upper position is the position where the first chemical liquid scattered from the wafer W that is rotated at a rotation speed of 1500 rpm can be most efficiently acquired in the first recovered liquid acquisition port 44. Even after the rotation speed of the wafer W is lowered to 500 rpm, therefore, the first chemical liquid scattered from the wafer W cannot be satisfactorily acquired in the first recovered liquid acquisition port 44 with the splash guard 18 arranged at the first chemical liquid acquisition upper position.

In the substrate processing apparatus, when the rotation speed of the wafer W is lowered to 500 rpm, therefore, the splash guard 18 is lowered from the first chemical liquid acquisition upper position to the first chemical liquid acquisition lower position slightly lower than the first chemical liquid acquisition upper position, as shown in FIG. 4 (*b*), in response thereto. The first chemical liquid acquisition lower position is the position where the first chemical liquid scattered from the wafer W can be most efficiently acquired in the first recovered liquid acquisition port 44 when the first chemical liquid is supplied to the surface and the reverse surface of the wafer W that is rotated at a rotation speed of 500 rpm, and is found by previously carrying out experiments. The driving amount of the guard up-and-down driving mechanism 31 (servo motor) for moving the splash guard 18 to the first chemical liquid acquisition lower position is stored in the ROM 50. The control device 51 controls the guard up-and-down driving mechanism 31 on the basis of the driving amount stored in the ROM 50, to move the splash guard 18 to the first chemical liquid acquisition lower position.

When 20 seconds have elapsed since the rotation speed of the wafer W was lowered to 500 rpm, the first chemical liquid lower valve 8 and the first chemical liquid upper valve 13 are closed. Thereafter, the rotation speed of the wafer W is raised from 500 rpm to 1500 rpm. Further, the guard up-and-down driving mechanism 31 is controlled, so that the splash guard 18 is lowered to a discharge position where the discharged liquid acquisition port 47 is opposed to the end surface of the wafer W.

Thereafter, the deionized water lower valve 11 and the deionized water upper valve 16 are opened, so that the deionized water is supplied to the rotation center on the surface of the wafer W from the nozzle 2 and is supplied from the reverse nozzle 12 to the rotation center on the reverse surface of the wafer W. The deionized water supplied to the surface and the reverse surface of the wafer W flow toward the peripheral edge of the wafer W by a centrifugal force produced by the rotation of the wafer W and is scattered sideward from the peripheral edge of the wafer W. Consequently, the first chemical liquid adhering to the surface and the reverse surface of the wafer W is washed away with the deionized water. The deionized water scattered from the peripheral edge of the wafer W (including the first chemical liquid washed away from the wafer W) is acquired in the discharged liquid acquisition port 47 opposed to the end surface of the wafer W at this time, is collected in the discharge groove 19, and is introduced into the discharge process facilities (not shown) through the discharge line 23 from the discharge groove 19.

When the supply of the deionized water is continued over a predetermined time period, the deionized water lower valve 11 and the deionized water upper valve 16 are closed so that the supply of the deionized water to the wafer W is stopped. Thereafter, the splash guard 18 is lowered from the discharge position to the retreat position, and the rotation speed of the wafer W is raised from 1500 rpm to 3000 rpm, to perform spin drying process for shaking down the deionized water adhering to the surface of the wafer W after rinsing process to dry the deionized water. When the spin drying process is performed over 120 seconds, the rotation of the wafer W is stopped, so that the wafer W that has been processed is carried out of the spin chuck 1.

As described in the foregoing, when the rotation speed of the wafer W is lowered from 1500 rpm to 500 rpm while the first chemical liquid is supplied to the wafer W, the position of the splash guard 18 is changed from the first chemical liquid acquisition upper position where the first chemical liquid scattered from the wafer W that is rotated at a rotation speed of 1500 rpm can be most efficiently acquired in the first recovered liquid acquisition port 44 to the first chemical liquid acquisition lower position where the first chemical liquid scattered from the wafer W that is rotated at a rotation speed of 500 rpm can be most efficiently acquired in the first recovered liquid acquisition port 44. Consequently, the first chemical liquid scattered from the wafer W can be satisfactorily acquired in the first recovered liquid acquisition port 44 and can be efficiently recovered throughout the whole period during which the first chemical liquid is supplied to the wafer W.

Figure 5:
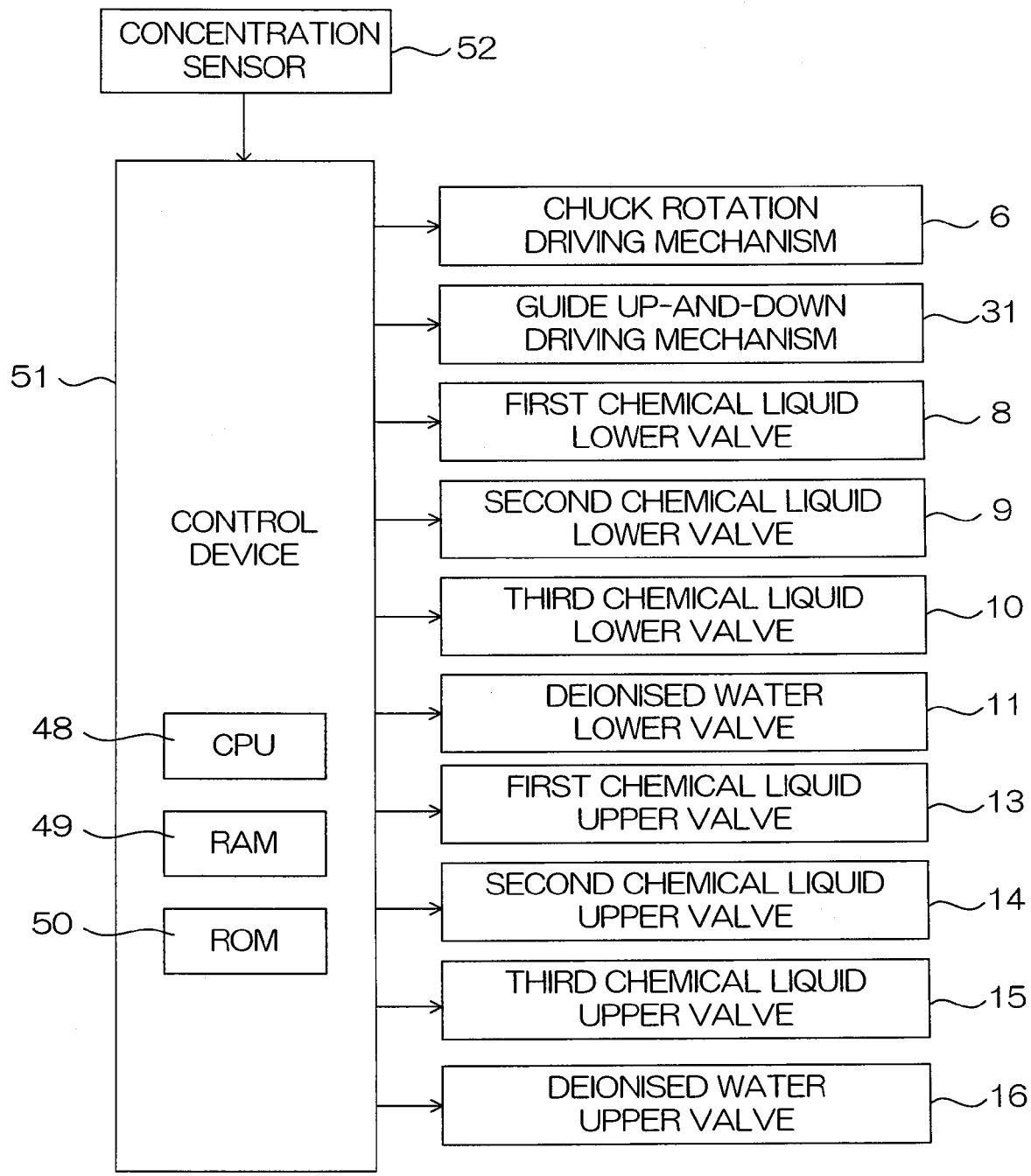
FIG. 5 is a block diagram showing the electrical configuration of a substrate processing apparatus according to another embodiment of the present invention.

FIG. 5 is a block diagram showing the electrical configuration of a substrate processing apparatus according to another embodiment of the present invention. Sections corresponding to the foregoing sections are assigned the same reference numerals in FIG. 5 and hence, the description thereof is not repeated In the substrate processing apparatus according to the present embodiment, a concentration sensor 52 for detecting the concentration of a first chemical liquid supplied to a nozzle 2 through a pipe for supplying the first chemical liquid to the nozzle 2, for example, is provided on the pipe. The concentration sensor 52 is connected to a control device 51. The control device 51 controls the operations of a chuck rotation driving mechanism 6 and a guard up-and-down driving mechanism 31 on the basis of a detection signal inputted from the concentration sensor 52, and controls the opening or closing of a first chemical liquid lower valve 8, a second chemical liquid lower valve 9, a third chemical liquid lower valve 10, a deionized water lower valve 11, a first chemical liquid upper valve 13, a second chemical liquid upper valve 14, a third chemical liquid upper valve 15, and a deionized water upper valve 16.

The first chemical liquid used for processing a wafer W is recovered in recovery treatment facilities for treating the first chemical liquid so as to be reusable, is fed from the recovery process facilities to a first chemical liquid supply source, and is supplied from the first chemical liquid supply source to the nozzle 2 and a reverse nozzle 12. While the first chemical liquid is supplied to the wafer W, therefore, the concentration of the first chemical liquid may, in some cases, be increased by evaporation, while being decreased due to inclusion of deionized water or the like. When the concentration of the first chemical liquid is thus changed, the viscosity of the first chemical liquid is changed depending on the change in the concentration, so that the direction of the first chemical liquid scattered from the wafer W is changed. Specifically, as the concentration of the first chemical liquid is increased, the viscosity of the first chemical liquid is increased, so that the direction of the first chemical liquid scattered from the wafer W is changed downward.

When the concentration of the first chemical liquid is divided into a plurality of stages, and the first chemical liquid having the concentration belonging to each of the stages is supplied to the wafer W, the positions of a splash guard 18 at which the first chemical liquid scattered from the wafer W can be most efficiently acquired in a first recovered liquid acquisition port 44 are previously found by experiments, and the driving amount of the guard up-and-down driving mechanism 31 (servo motor) for moving the splash guard 18 to each of the positions is stored in the ROM 50. The control device 51 (the CPU 48) controls the guard up-and-down driving mechanism 31 such that the splash guard 18 is always positioned at a suitable position corresponding to the concentration of the first chemical liquid detected by the concentration sensor 52 on the basis of data stored in the ROM 50 while the first chemical liquid is supplied to the wafer W. Specifically, as the concentration of the first chemical liquid is increased, the direction of the first chemical liquid scattered from the wafer W is changed downward, so that the guard up-and-down driving mechanism 31 is controlled such that the splash guard 18 is lowered. Consequently, the first chemical liquid scattered from the wafer W can be satisfactorily acquired in the first recovered liquid acquisition port 44 and can be efficiently recovered throughout the whole period during which the first chemical liquid is supplied to the wafer W.

Figure 6:
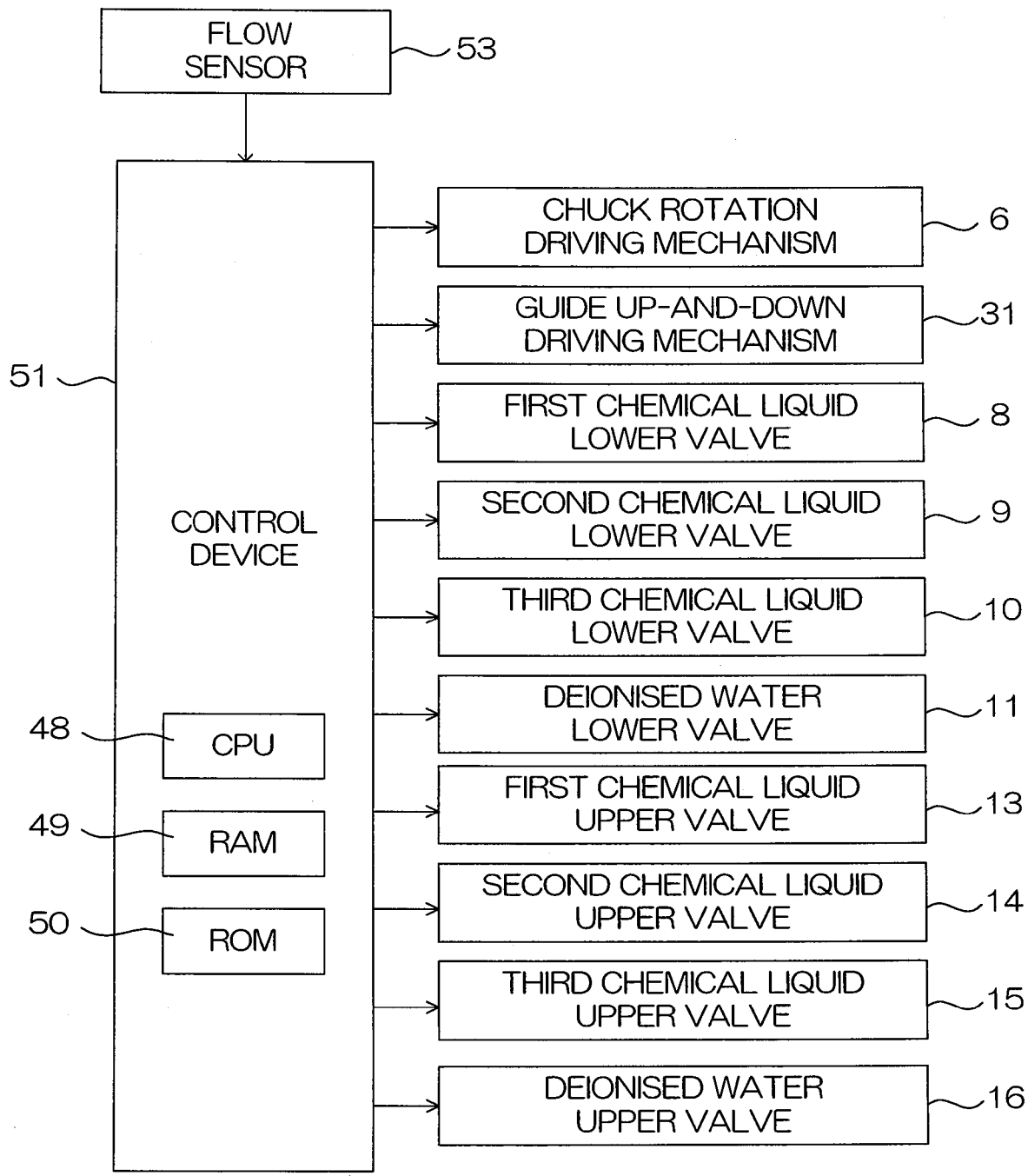
FIG. 6 is a block diagram showing the electrical configuration of a substrate processing apparatus according to still another embodiment of the present invention.

FIG. 6 is a block diagram showing the electrical configuration of a substrate processing apparatus according to still another embodiment of the present invention. Sections corresponding to the foregoing sections are assigned the same reference numerals in FIG. 6 and hence, the description thereof is not repeated In the substrate processing apparatus according to the present embodiment, a flow sensor 53 for detecting the flow rate of a first chemical liquid recovered through a first recovery line 24 is provided on the first recovery line 24, for example. The flow sensor 53 is connected to a control device 51. The control device 51 controls the operations of a chuck rotation driving mechanism 6 and a guard up-and-down driving mechanism 31 on the basis of a detection signal inputted from the flow sensor 53, and controls the opening or closing of a first chemical liquid lower valve 8, a second chemical liquid lower valve 9, a third chemical liquid lower valve 10, a deionized water lower valve 11, a first chemical liquid upper valve 13, a second chemical liquid upper valve 14, a third chemical liquid upper valve 15, and a deionized water upper valve 16.

More specifically, the control device 51 controls the guard up-and-down driving mechanism 31 after starting to supply the first chemical liquid to a wafer W, to raise and lower a splash guard 18 back and forth within a range in which a first recovered liquid acquisition port 44 is opposed to an end surface of the wafer W. While the splash guard 18 is raised and lowered back and forth, an output of the flow sensor 53 is monitored, to specify the position of the splash guard 18 in a case where the flow rate of the first chemical liquid flowing through the first recovery line 24 is the highest and to arrange the splash guard 18 at the specified position. Thereafter, the splash guard 18 is raised and lowered back and forth again when the flow rate of the first chemical liquid detected by the flow sensor 53 is changed, to specify the position of the splash guard 18 in a case where the flow rate of the first chemical liquid flowing through the first recovery line 24 is the highest and to arrange the splash guard 18 at the specified position. Consequently, the splash guard 18 can be positioned at the position where the first chemical liquid scattered from the wafer W can be satisfactorily acquired in the first recovered liquid acquisition port 44 and can be efficiently recovered throughout the whole period during which the first chemical liquid is supplied to the wafer W.

The above-mentioned three embodiments may be independently carried out, or may be carried out in combination, for example, in combination of the first embodiment and the second embodiment. That is, such control may be carried out that the rotation speed of the wafer W and the concentration of the first chemical liquid are used as parameters, to previously find each of the positions of the splash guard 18 at which the first chemical liquid scattered from the wafer W can be most satisfactorily acquired in the first recovered liquid acquisition port 44 when each of the parameters is changed, store the driving amount of the guard up-and-down driving mechanism 31 for moving the splash guard 18 to the position in the ROM 50, and always move the splash guard 18 to the most suitable position on the basis of data stored in the ROM 50 throughout the whole period during which the first chemical liquid is supplied to the wafer W.

The position of the splash guard 18 may be controlled on the basis of other substrate process conditions under which the direction of the first chemical liquid scattered from the wafer W is changed irrespective of the rotation speed of the wafer W and the concentration of the first chemical liquid. The viscosity of the first chemical liquid, the temperature of the first chemical liquid, the supply angle of the first chemical liquid supplied to the wafer W from the nozzle 2 (the position and/or the height in the horizontal direction of the nozzle 2), etc. can be exemplified as substrate process conditions other than the rotation speed of the wafer W and the concentration of the first chemical liquid. As the viscosity of the first chemical liquid is increased, the direction of the first chemical liquid scattered from the wafer W is changed downward. Therefore, the guard up-and-down driving mechanism 31 may be controlled such that the splash guard 18 is lowered. Further, as the temperature of the first chemical liquid is lowered, the viscosity of the first chemical liquid is increased. Therefore, the same control may be carried out on the basis of the temperature of the first chemical liquid.

Furthermore, when process liquids that differ in type are acquired in the same first recovered liquid acquisition port 44, second recovered liquid acquisition port 45, third recovered liquid acquisition port 46, or discharged liquid acquisition port 47, the position of the splash guard 18 may be controlled depending on the type of the process liquid. When both the first chemical liquid and the deionized water for washing away the first chemical liquid from the wafer W are acquired in the discharged liquid acquisition port 47 and discharged, for example, the respective positions of the splash guard 18 at the time of supplying the first chemical liquid and at the time of supplying the deionized water to the wafer W may differ such that the first chemical liquid and the deionized water scattered from the wafer W can be respectively satisfactorily acquired in the discharged liquid acquisition port 47.

Furthermore, although a case where the first chemical liquid is supplied to the wafer W is taken as an example, the position of the splash guard 18 may be also controlled, similarly to a case where the first chemical liquid is supplied, when the second chemical liquid or the third chemical liquid is supplied to the wafer W.

The nozzle 2 may be fixedly arranged above the spin chuck 1, or may have the shape of a scan nozzle capable of moving the supply position of the process liquid on the surface of the wafer W while drawing a trace in a circular arc shape between the rotation center of the wafer W and a peripheral edge of the wafer W.

Furthermore, although in each of the embodiments, a configuration in which the splash guard 18 is raised or lowered, to change the relative position between the splash guard 18 and the wafer W held in the spin chuck 1 is taken as an example, the spin chuck 1 may be raised or lowered to change the relative position between the splash guard 18 and the wafer W held in the spin chuck 1.

Although the present invention has been described and illustrated in detail, it is clearly understood that the same is by way of illustration and example only and is not to be taken by way of limitation, the spirit and scope of the present invention being limited only by the terms of the appended claims.

The present application corresponds to an application No. 2004-250494 filed with the Japanese Patent Office on Aug. 30, 2004, the disclosure of which is hereinto incorporated by reference.

What is claimed is:

1. A substrate processing method, comprising the steps of:
   supplying a process liquid to a substrate while rotating the substrate;
   arranging a process liquid acquisition section so as to enclose the substrate, the acquisition section and an acquisition port thereof being disposed for acquiring a process liquid scattered by the rotation of the substrate;
   using said process liquid acquisition section to acquire the process liquid scattered from the substrate in said acquisition port; and
   controlling a relative position between the substrate and the acquisition port such that the scattered process liquid is acquired in the acquisition port on the basis of a predetermined substrate process condition;
   said controlling step including, while the scattered process liquid is being acquired in the acquisition port, and the same process liquid continues being supplied to the substrate, the step of controlling the relative positions of the substrate and the acquisition port, to change said relative positions in response to a change of the rotation speed of the substrate, such that the scattered process liquid continues entering into the acquisition port regardless of the rotation speed of the substrate.

2. The substrate processing method according to claim 1, wherein
   said relative position of the substrate and the acquisition port is controlled such that in a first case where the rotation speed is a first speed, a position of the acquisition port is higher than a position of the acquisition port in a second case where the rotation speed is a second speed lower than the first speed.

3. The substrate processing method according to claim 1, wherein
   a most suitable relative position between the substrate and the acquisition port, corresponding to a substrate process condition, is stored in a storage mechanism,
   when the process liquid scattered from the substrate is acquired in the acquisition port, the relative position between the substrate and the acquisition port is controlled to be the most suitable relative position stored in the storage mechanism.

4. The substrate processing method according to claim 1, further comprising the step of detecting measured values of the substrate process condition, wherein
   when the process liquid scattered from the substrate is acquired in the acquisition port, the relative position between the substrate and the acquisition port is controlled on the basis of the measured values detected in the detecting step.

5. The substrate processing method according to claim 1, wherein said predetermined substrate process condition further includes a state of the processing liquid supplied from the process liquid supply mechanism, said state being selected from the group consisting of the concentration, temperature, viscosity and type of the process liquid.

6. The substrate processing method according to claim 1, wherein said predetermined substrate process condition further includes a discharge angle of the process liquid supplied from the process liquid supply mechanism.

7. The substrate processing method according to claim 1, wherein said predetermined substrate process condition further includes a discharge position of the process liquid supplied from the process liquid supply mechanism.

* * * * *